United States Patent
Rijssemus et al.

(10) Patent No.: US 7,679,471 B2
(45) Date of Patent: Mar. 16, 2010

(54) SIGNAL SPLITTER CIRCUIT WITH PREVENTION CIRCUITRY TO REDUCE GENERATION OF INTERMODULATION PRODUCTS

(75) Inventors: Martien Rijssemus, Hee Isun (NL); Andries Peter Roodbeen, Veenendaal (NL)

(73) Assignee: Technetix Group Limited (GB)

( * ) Notice: Subject to any disclaimer, the term of this patent is extended or adjusted under 35 U.S.C. 154(b) by 299 days.

(21) Appl. No.: 11/761,723

(22) Filed: Jun. 12, 2007

(65) Prior Publication Data

US 2009/0100491 A1     Apr. 16, 2009

Related U.S. Application Data

(63) Continuation-in-part of application No. 11/204,608, filed on Aug. 16, 2005.

(30) Foreign Application Priority Data

Aug. 12, 2005    (GB) .................................. 0516561.8

(51) Int. Cl.
    *H04B 3/28*    (2006.01)

(52) U.S. Cl. ........................... 333/124; 333/12; 333/138
(58) Field of Classification Search ......... 333/124–129, 333/138, 12, 238
    See application file for complete search history.

(56) References Cited

U.S. PATENT DOCUMENTS

| 3,895,321 | A | * | 7/1975 | Seidel | 333/109 |
|---|---|---|---|---|---|
| 3,974,465 | A | * | 8/1976 | White | 333/164 |
| 4,217,554 | A | * | 8/1980 | Brzozowski | 330/124 R |
| 4,323,863 | A | * | 4/1982 | Weber | 333/109 |
| 6,538,528 | B2 | * | 3/2003 | Louzir et al. | 333/128 |
| 6,922,169 | B2 | * | 7/2005 | Moh'd Izzat et al. | 342/360 |

* cited by examiner

*Primary Examiner*—Robert Pascal
*Assistant Examiner*—Kimberly E Glenn
(74) *Attorney, Agent, or Firm*—Barnes & Thornburg LLP

(57) ABSTRACT

A signal splitter for reducing noise ingress and a cable television network incorporating such splitters. A signal splitter has an input and a plurality of outputs, where alternate outputs are connected to phase shifting devices. Prevention circuitry is provided for at least preventing the generation of intermodulation products in the phase shifting devices. The prevention circuitry is provided with a pre-connected filter in the form of a high-pass filter for stopping voltage peaks through reflection of the energy contained in the voltage peaks.

11 Claims, 2 Drawing Sheets

SIGNAL SPLITTER CIRCUIT WITH PREVENTION CIRCUITRY TO REDUCE GENERATION OF INTERMODULATION PRODUCTS

RELATED APPLICATION

This application is a continuation-in-part of co-pending U.S. patent application Ser. No. 11/204,608, filed Aug. 16, 2005.

FIELD OF THE INVENTION

This invention relates to a signal splitter circuit for reducing noise ingress and a cable television network incorporating such splitters.

BACKGROUND TO THE INVENTION

Cable television networks are no longer purely distribution networks used for TV and radio distribution, but now also provide access for the customer to the networks. Thus TV and radio signals are distributed from a local centre or optical node by way of a signal splitter with an output connected to each customer. Return traffic from each customer is returned through the splitter to the local centre or optical node and thence to the rest of the network. Such return traffic might include requests for pay-per-view television programmes.

Usually the traffic from the customer to the local centre or optical node is called "return path traffic" or "upstream signals". The upstream signals are transported using a different frequency range than the distribution signals (usually called "downstream signals") originating from the network provider. Modern cable TV networks typically use 5 MHz to 65 MHz for upstream signals and 85 MHz to 862 MHz for downstream signals, although other frequency ranges are also used.

All upstream signals, no matter how they originate, are transported to the local centre or optical node. Thus unwanted noise in upstream signals will also be injected into the network. The unwanted signals originate from various sources but a major part is due to radiation of outside transmitters in the used upstream frequency range. The total sum of these unwanted signals is known as "ingress". The majority of ingress originates from the in-house installation of the customer and is therefore injected into the network at a customer access point. This ingress is a major problem in the network since all these unwanted signals are summed and will limit the signal to noise ratio (and therefore the capacity) of the upstream signals.

It is an aim of the present invention to provide a signal splitter circuit which reduces noise ingress into a cable television distribution network.

SUMMARY OF THE INVENTION

In accordance with the present invention, there is provided a signal splitter circuit comprising a signal splitter having an input and a plurality of outputs, wherein alternate outputs are connected to phase shifting devices, and prevention circuitry for at least partially preventing the generation of intermodulation products in the phase shifting devices, wherein said prevention circuitry is provided with a pre-connected filter comprising a high-pass filter for stopping voltage peaks through reflection of the energy contained in the voltage peaks. Where such a signal splitter is used in a cable television network, the phase shifting devices ensure that noise ingress in upstream signals, i.e. those originating from the customer, passing into the network is substantially reduced. The upstream signals are made up of signals from a number of different customers, each customer signal including data and noise components. The data components from different customers are unrelated in amplitude, phase, and frequency as they originate from different subscriber equipment. However the noise components in each customer signal are similar to one another because they originate for the most part from the same source, namely radio frequency electromagnetic radiation picked up by the equipment of the subscribers and the cables connecting such equipment to the outputs of the splitter. Introduction of a phase shift into the upstream signal before it reaches an output ensures that the noise components cancel one another when the upstream signals originating from the customers are summed by the splitter.

During production, splitters and taps are so-called Degaussed in order to ensure the ferrite cores are magnetically neutral. In this case the transfer function of the passive element is as linear as possible reducing the amount of generated intermodulation products. During its operational lifetime a passive element is exposed to all sorts of low and high voltage impulses. These impulses induce a DC current through the windings on the ferrite cores.

This current produces a magnetic field that will influence the magnetic neutrality of the ferrite. Depending on the ferrite material, the strength of the pulse and the amount of pulses the ferrite will be magnetized over time as the effect is cumulative and the intermodulation performance of the element will degrade. The prevention circuitry prevents pulses from reaching the ferrite core of the phase shifting device by reflecting the energy in the pulse, thus creating an effective protection against degradation of the intermodulation performance. The intermodulation originates from the strong cable modem upstream signal present at the passive element and is typically 2 times or 3 times the frequency of the original signal. This frequency is present in the CATV downstream spectrum and will interfere with the received radio and/or TV signals.

The signal splitter with its phase shifting devices reduces ingress in the upstream path by phase inverting half of the ports of a passive element. However the 180° phase shift transformer is susceptible to degradation caused by voltage pulses. When more than 1 cable modem is connected to the same passive device (e.g. a set top box and a VoiP box) the generated intermodulation products will not only be present in the CATV downstream spectrum but also in the upstream spectrum. The generated intermodulation products will be seen as upstream ingress and will seemingly reduce the improvement in ingress levels by the splitter technology.

By combining the prevention circuitry with the signal splitter and phase shifting devices, the resulting signal splitter circuitry becomes more effective when more than one cable modem is used since the phase shift transformer is effectively protected against intermodulation degradation caused by voltage pulses.

The prevention circuit is based on the insight that the relatively low signal-to-noise ration of the data signals in the known communication system is caused in part by the signal processing means or components that are incorporated in (in particular bidirectional) cable transmission networks. The cable modems that are used generate a strong RF signal that is capable of generating harmonics or intermodulation products in said components (in particular in passive components). These undesirable products interfere with the normal data signals, which has an adverse effect on the signal-to-noise ratio of these normal data signals. By providing the signal processing means with a prevention circuit for at least partially preventing the generation of intermodulation products in the signal processing means, the generation of harmonics or intermodulation products can be prevented in whole or in part, which has a positive effect on the signal-to-noise ratio of the data signals.

The prevention circuit is further based on the following insight: the greatest problems with regard to degeneration of harmonics or intermodulation products occur with passive components comprising ferrite transformers and/or connectors. Said ferrite elements usually have a non-linear transfer function, which is caused by saturation of the ferrite. Said saturation can already occur with relatively low-level input signals when the ferrite has been affected by a magnetic field. Said magnetic field may be an external magnetic field or a magnetic field that has been generated by a current flowing through the transformer windings. A voltage peak is capable of introducing such a current into the transformer, causing the ferrite to become saturated already at a lower transmission level or signal level, as a consequence or which harmonics or intermodulation products can be generated sooner. This can be prevented by preventing the occurrence of voltage peaks by means of a filter at the input of the signal processing means, in which the filter reflects the energy contained in the voltage peaks.

In general it can be stated that voltage peaks in cable transmission networks, for example in cable television (CATV) networks, are capable of causing major problems. Said peaks may be caused by lightning or by equipment connected to the network. The voltage peaks generated by connected equipment, on the other hand, have a relatively low voltage level.

It is a known fact that gas discharge tubes and very fast varistors can be used as protection means against the voltage peaks having a high voltage level. Said known protection means have the following drawbacks. In the first place, said known protection means do not provide any protection against the harmful effects of voltage peaks having a low voltage level. In the second place, said known protection means generate strong magnetic fields, since they neutralize the voltage peaks by means of a short-circuit, in which very high short-circuit currents of 1000 Amp or higher can flow through the protection means, which magnetic fields may have an adverse effect on the intermodulation behaviours of passive components when the protection means is incorporated in such a passive component. In addition to that, the short-circuit can lead to the generation of voltage peaks having a high voltage level and a low energy level (comparable to electrostatic discharge (ESD) pulses) if the load exhibits an inductive and/or capacitive behaviour (which will generally be the case). Under certain circumstances, these newly generated voltage peaks having a high voltage level and a low energy level may even cause permanent damage to certain components in the cable transmission network.

The prevention circuit as used in the communication system according to the invention does not make use of gas discharge tubes or varistors, but uses a filter for preventing voltage peaks from entering into the components by reflecting the energy. Since there is no question of a short-circuit and of the accompanying very high short-circuit currents (the energy of the voltage peaks is reflected and there is no current flow) in this arrangement, there is no question of a (high) magnetic field being generated, either. As a result, the aforesaid voltage peaks having a high voltage level and a low energy level will not be generated.

As a result of the high-pass behaviour of the filter, protection is obtained both against voltage peaks having a high voltage level and against voltage peaks having a low voltage level.

One embodiment of the communication system according to the invention is characterized in that the high-pass filter comprises an LC-filter including at least one coil and at least one capacitor. It has become apparent that in an advantageous embodiment the pre-connected filter can be an LC-filter consisting of coils and capacitors, in which the capacitors are preferably high-voltage capacitors having a low temperature co-efficient.

Preferably the phase shifting devices introduce a phase shift of 180°, so that noise components of alternate outputs are in antiphase and cancel one another out almost entirely when the signals are summed.

Each phase shifting device may comprise a phase shifting transformer.

Where the splitter has an even number N of outputs, N/2 phase shifting devices will be required, N/2 being a whole number. Where the splitter has an odd number X of outputs, then the number of phase shifting devices used will be the nearest whole number above or below X/2.

If required the phase shifting devices may be permanently connected to their respective outputs and secured within a common housing to the outputs, so being built into the splitter. Alternatively the phase shifting devices may be separable from their respective outputs.

In accordance with another aspect of the invention, there is provided a cable television network incorporating a plurality of signal splitters circuits, the phase shifting devices acting in use to ensure that noise ingress in upstream signals, i.e. those originating from the customer, passing into the network is substantially reduced.

BRIEF DESCRIPTION OF THE DRAWING FIGURES

The invention will now be described by way of illustrative example and with reference to the attached drawing figures, in which.

DESCRIPTION

Figure 1:
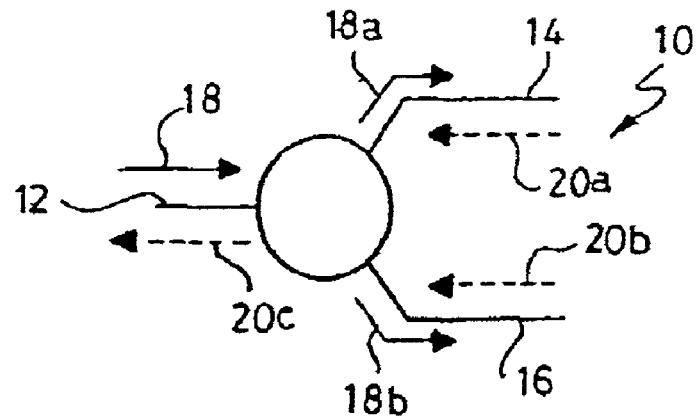
FIGS. 1 and 2 are schematic diagrams of prior art signal splitters.
Figure 2:
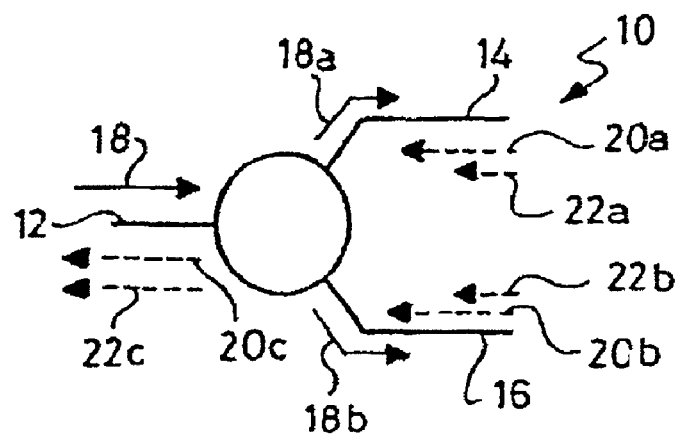

The prior art signal splitter 10 of FIGS. 1 and 2 comprises an input 12 and a large number of outputs, of which only a first output 14 and a second output 16 are shown for the purpose of clarity. In use these passive signal dividers 10 act as an interface between a local centre or node and a number of customers, each customer connected to one output of the splitter 10, with the splitter input 12 connected to the node. Arrow 18 represents transmission of television signals (downstream signals) from the service provider to the input of the splitter where the signal is divided or split for onward transmission to the customer, arrows 18a and 18b representing transmission of split television signals from the first and second outputs 14, 16 of the splitter 10.

Dotted arrows 20a and 20b represent the return transmission of data signals (upstream signals) from the first and second subscribers to the first and second outputs of the splitter. The splitter sums the data signals from all subscribers to which it is connected and applies them to the input of the splitter. Dotted arrow 20c represents transmission of all summed data signals from the input of the splitter to the service provider.

Turning to FIG. 2, short dotted arrows 22a and 22b represent noise components present in the data signals transmitted from the subscribers to the first and second inputs of the splitter. The splitter 10 not only sums the wanted data signal but also sums the noise components and applies them to the input 12 of the splitter. Long dotted arrow 22c represents transmission of the summed noise signals from the input of the splitter to the service provider.

With a large number of outputs, the summed noise components applied to the input of the splitter (and hence transmitted from the input of the splitter to the service provider) become significant in comparison with the data signals, thus reducing the signal transmission capacity of the upstream channel between the splitter and the service provider. By way of example, suppose there are 1000 customers connected to a single local centre or optical node. If all customers produce the same amount of ingress then the total signal to noise ratio at the local centre or optical point will degrade with a factor 1000 or 30 dB.

Figure 3:
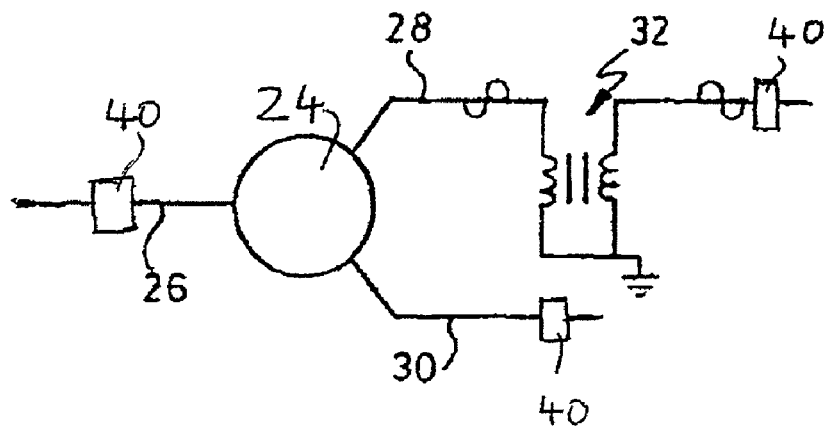
FIG. 3 is a schematic diagram of a signal splitter circuit in accordance with the invention.

A splitter circuit in accordance with the present invention is shown in FIG. 3 and comprises a splitter 24 with an input 26, a plurality of outputs of which only a first output 28 and a second output 30 are shown for clarity, and a plurality of phase shift transformers connected to alternate outputs, of which only transformer 32 connected to the first output 28 is shown. Each transformer is only connected to one output. The phase shift transformers can be built into the splitter and permanently associated with their respective outputs. Alternatively the transformers can be connected externally to existing outputs.

The phase shift transformer 32 introduces a 180° phase shift into signals that pass through it. Thus split television signals applied to the first output 28 are shifted in phase by 180° before being transmitted to the subscriber, and data signals transmitted by a subscriber's equipment connected to the first output 28 are shifted in phase by 180° before being applied to the first output 28.

As explained above, the data signals transmitted by the subscribers to the outputs of the splitter include noise components. The noise components have various sources, the most significant of which is radio frequency electromagnetic radiation, which can be picked up by the subscribers' equipment and the cables connecting the outputs of the splitter to the equipment of the subscribers. In most cases, a source of radio frequency electromagnetic radiation that is picked up by one such cable or subscriber's equipment will be picked up by a large number of other such cables or subscribers' equipment.

The signal characteristics of the noise components will be very similar because they arise for the most part from the same source. The noise components will have much the same frequency, amplitude and phase. The phase shift transformers connected to alternate outputs of the splitter give rise to two groups of noise components. The noise components of both groups have much the same frequency and amplitude, but the noise components of the first group are in antiphase with the noise components of the second group. When the noise components of both groups are summed, they cancel each other out so that the noise components of the summed signals applied to the input of the splitter are much reduced.

The wanted data signals originating from the customer are unaffected as the data components from different customers are unrelated in amplitude, phase, and frequency as they originate from different subscriber equipment. They are therefore not reduced by summation after phase shifting. The downstream signal is also not affected by the phase shift, and thus by using a phase shifting transformer mounted between the splitter output and the connected branch of the network, wanted downstream and upstream signals are unaffected whilst ingress is attenuated.

Of course, there are some localised sources of radio frequency electromagnetic radiation that are picked up by only one subscriber's equipment or one cable, such as an electric motor in an appliance in a house of a subscriber. The introduction of the phase shift cannot reduce such a noise component.

Many houses have connections to two outputs of the splitter, one connection being used for cable television and the other for telephone or internet service. Provided that one connection is to an output of the splitter with a phase shift transformer and the other connection is to an output without such a transformer, noise components due to even a localised source of radio frequency electromagnetic radiation can be reduced.

Prevention circuitry 40 is connected in the input 26 and in each output 28, 30. In the case of each output 28, the transformer 32 is connected between the splitter 24 and the corresponding prevention circuitry 40.

Figure 4:
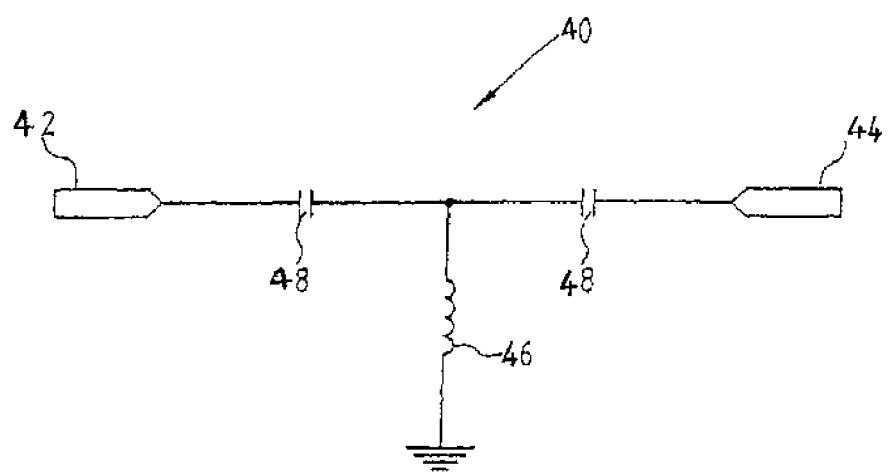
FIGS. 4 and 5 are circuit diagrams of two prevention circuits employed in the signal splitter circuit of FIG. 3.
Figure 5:
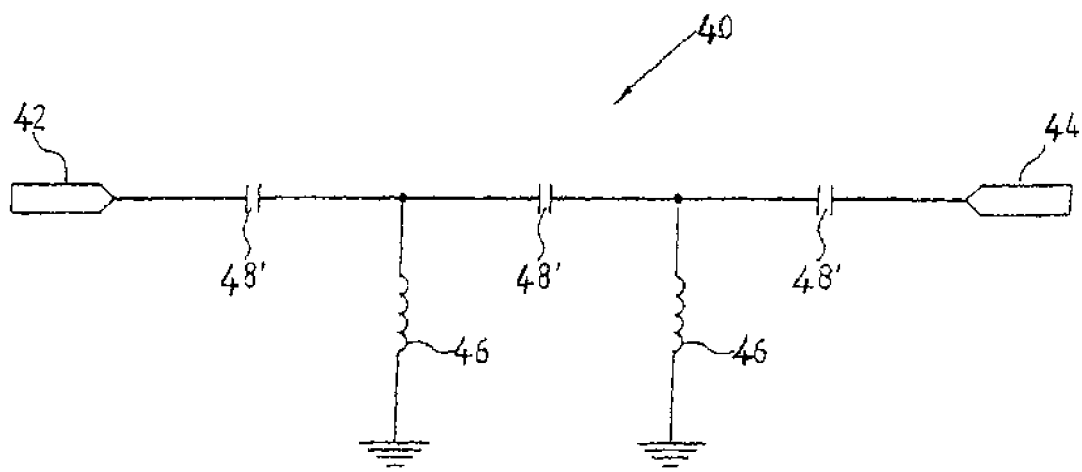

FIGS. 4 and 5 show two embodiments of prevention circuitry in the form of high-pass filters 40, which can be arranged in or before the signal processing means or components as a pre-connected filter (prevention means). The high-pass filters 40 that are shown in the figure each comprise an input 42, an output 44 and an LC-filter consisting or one or more coils 46 and a number of capacitors 48, which is arranged between said input and said output. Preferably, but not necessarily, the capacitors 48 are all high-voltage capacitors having a relatively low temperature co-efficient. Also other filter configurations are possible: higher-order filters based on the same principle (Chebishev) or filters based on other principles (Cauer filters or elliptical filters) may be used.

The coils 46 and the capacitors 48 in the high-pass filters 40 that are shown in FIGS. 4 and 5 preferably have the following values.

| | |
|---|---|
| coils 46 | 3.3 μH |
| capacitors 48 | 1nF/2kV/Y5E |
| capacitor 48' | 470 preferably |

The high-pass filter 40 that is shown in FIG. 5 provides a better protection against voltage peaks than the high-pass filter that is shown in FIG. 4. The filter that is shown in FIG. 5, however, is more complex, more expensive and takes up more space than the filter that is shown in FIG. 4. In particular the latter aspect may be of importance when building the filter into a CATV component.

In order to evaluate the behaviour of the filter that is shown in FIG. 4, said filter was built into a standard CATV insulator. Such an insulator is generally used as a terminal connecting point between a CATV network and an in-house installation, thus forming a suitable point for building in a protection means against lightning. The in-house installation may comprise amplifiers, cable modems, set top boxes, video recorders and televisions, for example.

In a first experiment, a standardised IEC 1000-4-5 level 2 pulse (1 kV, 1.2 μs/50 μs) was fed to the input of such a standard CATV insulator with and without the filter that is shown in FIG. 4. In the case of an unprotected CATV insulator (i.e. without the pre-connected filter), it appeared that the voltage peak was transmitted to the in-house installation practically without attenuation (1 kV peak decreasing to 0 V in 180 μs) by the CATV insulator, which may lead to serious damage to components and equipment in the installation. The protected CATV insulator (i.e. with the pre-connected filter), on the other hand, attenuated the voltage peak to a voltage peak having a low voltage level and a low energy level (40V peak decreasing to 0 V in only 0.2 μs). Even very sensitive components or equipment will not be damaged by this attenuated voltage peak.

The diminution of the intermodulation behaviour of a passive CATV component (in this case a standard CATV splitter) was experimentally determined in a second experiment by onserving the second harmonic of a 40 MHz, 118 dBμV (75 Ohm) input signal after all gates of the passive CATV component had been subjected to a 25V DC/500 μs voltage peak. It has become apparent that a CATV splitter protected by the pre-connected filter as shown in FIG. 4 does not exhibit any diminution of the intermodulation behaviour compared with a CATV splitter to which no voltage peak was fed in advance. An unprotected CATV splitter, on the other hand, exhibits a deterioration of the intermodulation behaviour of 10 dB.

Even in the case where a series of five successive IEC 100-4-5 level 2 voltage peaks are presented to the protected CATV splitter in advance, a diminution of the intermodulation behaviour cannot be observed. In the case of the unprotected CATV splitter, this situation leads to a deterioration of the intermodulation behaviour by at least 25 dB.

Further experiments have shown that the filter as shown in FIG. 4 has an extremely low insertion loss of less than 0.5 dB to 1000 MHz, and that at the same time it has a very favourable return loss of more than 20 dB.

The signal splitter circuit of the invention is dependent for successful operation on similarity between the noise components of data signals applied to the outputs of the splitter. The reduction of the noise components in the summed data signals will be less pronounced if the noise components are of different amplitudes or experience different phase shifts during transmission from the subscribers' equipment to the outputs of the splitter. Nevertheless, a reduction of only 3 dB of the noise components can give rise to a doubling of the data transmission capacity of the upstream signal channel.

The reduction of the noise components is slightly less pronounced if the splitter has an odd number of outputs. In this case the number of phase shifters attached to the outputs should be as close as possible to half the number of outputs, for example two or three phase shifters for a splitter with five outputs. Of course, for a splitter with a larger odd number of outputs, the effect of having phase shifters attached to slightly less or more than half the outputs of the splitter decreases with increasing numbers of outputs.

The invention claimed is:

1. A signal splitter circuit comprising a signal splitter having an input and a plurality of outputs, wherein alternate one of said plurality of outputs are connected to phase shifting devices, and prevention circuitry for at least partially preventing the generation of intermodulation products in the phase shifting devices, wherein said prevention circuitry is provided with a pre-connected filter comprising a high-pass filter for stopping voltage peaks through reflection of the energy contained in the voltage peaks.

2. A signal splitter circuit according to claim 1, wherein the prevention circuitry is connected in the input to the splitter.

3. A signal splitter circuit according to claim 2, wherein prevention circuitry is additionally connected in each one of said plurality of outputs, in each said alternate output the corresponding phase shifting device being connected between the splitter and the corresponding prevention circuitry.

4. A signal splitter circuit according to claim 1, wherein the high-pass filter comprises an LC-filter including at least one coil and at least one capacitor.

5. A signal splitter circuit according to claim 4, wherein said at least one capacitor is a high-voltage capacitor.

6. A signal splitter circuit according to claim 5, wherein the high-voltage capacitor has a relatively low temperature coefficient.

7. A signal splitter circuit according to claim 1, wherein the phase shifting devices introduce a phase shift of 180°, so that noise components of said alternate one of said plurality of outputs are in antiphase and cancel one another out almost entirely when summed.

8. A signal splitter circuit according to claim 1, wherein each of said phase shifting devices comprises a phase shifting transformer.

9. A signal splitter according to claim 1, wherein the phase shifting devices are permanently connected to said alternative one of said plurality of outputs and secured within a common housing to the outputs, so being built into the splitter circuit.

10. A signal splitter according to claim 1, wherein the phase shifting devices are separable from said alternate one of said plurality of outputs.

11. A cable television network incorporating a plurality of signal splitter circuits each according to claim 1, the phase shifting devices acting in use to ensure that noise ingress in upstream signals, originating from a customer, is substantially reduced.

* * * * *